(12) United States Patent
Park et al.

(10) Patent No.: US 6,753,126 B2
(45) Date of Patent: Jun. 22, 2004

(54) POLYMER FOR CHEMICALLY AMPLIFIED RESIST AND CHEMICALLY AMPLIFIED RESIST COMPOSITION CONTAINING THE SAME

(75) Inventors: Joohyeon Park, Chonan (KR); Dongchul Seo, Chonan (KR); Jongbum Lee, Asan (KR); Hyunpyo Jeon, Chonan (KR); Seongju Kim, Taejeon (KR)

(73) Assignee: Korea Kumho Petrochemical Co., Ltd., Seoul (KR)

( * ) Notice: Subject to any disclaimer, the term of this patent is extended or adjusted under 35 U.S.C. 154(b) by 152 days.

(21) Appl. No.: 10/073,693

(22) Filed: Feb. 11, 2002

(65) Prior Publication Data

US 2002/0177068 A1 Nov. 28, 2002

(30) Foreign Application Priority Data

May 28, 2001 (KR) ........................................ 2001-29352

(51) Int. Cl.$^7$ ............................ G03C 1/73; G03F 7/039; G03F 7/20; C08F 218/02
(52) U.S. Cl. .................... 430/270.1; 430/326; 430/910; 430/907; 430/914; 430/921; 430/925; 526/320; 526/328; 526/328.5; 526/329; 526/329.2; 526/329.6; 526/329.7
(58) Field of Search .............................. 430/270.1, 910, 430/907, 914, 921, 925, 326; 526/328, 328.5, 329.6, 329.7, 320, 329, 329.2

(56) References Cited

U.S. PATENT DOCUMENTS

2002/0009666 A1 * 1/2002 Sato et al. ............... 430/270.1

OTHER PUBLICATIONS

Robert D. Allen, et al., "Protecting Groups for 193–nm Photoresists", SPIE vol. 2724, pp. 334–343.

Thomas I. Wallow, et al., "Evaluation of Cycloolefin–Maleic Anhydride Alternating Copolymers as Single–Layer Photoresists for 193 nm Photolithography", SPIE vol. 2724, pp. 355–364.

* cited by examiner

Primary Examiner—Mark F. Huff
Assistant Examiner—Sin J. Lee
(74) Attorney, Agent, or Firm—Davidson, Davidson & Kappel, LLC

(57) ABSTRACT

Disclosed is a polymer for use in a chemically amplified resist, a resist composition including such a polymer is suitable for use in a chemically amplified resist, which is sensitive to KrF or ArF excimer laser and forms a photoresist pattern having low dependence on and good adhesion to substrate, high transparency in the wavelength range of the above radiation, strong resistance to dry etching, and excellencies in sensitivity, resolution and developability. The resist composition can have a stronger etching resistance with a maximized content of unsaturated aliphatic ring in the polymer and a reduced edge roughness of the photoresist pattern with an alkoxyalkyl acrylate monomer employed.

9 Claims, No Drawings

POLYMER FOR CHEMICALLY AMPLIFIED RESIST AND CHEMICALLY AMPLIFIED RESIST COMPOSITION CONTAINING THE SAME

BACKGROUND OF THE INVENTION

The present invention relates to a polymer with increased adhesion to substrate and a resist composition containing the same. More particularly, the present invention relates to a novel polymer that is useful for preparation of a photoresist suitable for fine works using various radiations, such as KrF or ArF excimer laser, X-rays such as synchrotron radiation, and charged particle rays such as electron beam, and a resist composition containing the polymer.

With an increase in the integration density of semiconductor devices, there is a demand for super-fine patterns of which the size is 0.13 μm or smaller in the manufacture of very large scale integration(VLSI). Accordingly, the radiations used as a conventional exposure source, such as g- or i-ray, have become replaced by those that have a shorter wavelength, and lithographic techniques using KrF or ArF excimer laser, X-ray or electron beam have lately attracted considerable attention. Especially, an ArF excimer laser is a most promising exposure source in the future lithography requiring a pattern size of 0.13 μm or smaller.

A resist composition suitable for fine works using such radiations is composed of a component having an acid-liable functional group (hereinafter, referred to as "polymer"), a component generating an acid upon light radiation (hereinafter, referred to as "photoacid generator"), and a solvent. Such a resist composition may additionally comprise a dissolution inhibitor or a base additive.

On the other hand, the polymer useful as a principal component of the resist composition is required to have a low absorbance in the wavelength range of the exposure source.

The chemically amplified resist used in the conventional radiation of a KrF excimer laser is mostly composed of a phenol-based polymer as a principal component, with a disadvantage in that the polymer shows a high absorbance in the range of the ArF excimer laser region due to aromatic rings included therein. Such a high absorbance in the wavelength range may deteriorate the perpendicularity and hence the resolution of the resulting photoresist pattern.

To solve this problem, many studies have been made on resins destitute of unsaturated hydrocarbon or aromatic group as a polymer suitable for use in a photoresist composition sensitive to an ArF excimer laser. Examples of such polymers that exhibit a relatively low absorbance in the wavelength range of the ArF excimer laser may include acrylate polymer, olefin polymer and maleic anhydride-cycloolefin polymer.

Such polymers as disclosed in the prior documents include an acrylate polymer containing an alicyclic group (See SPIE, 1996, vol. 2724, at p. 334) and a maleic anhydride-cycloolefin polymer (See SPIE, 1996, vol. 2724, at p. 355). The acrylate polymer had a low optical absorbance in the wavelength range of the ArF excimer laser but shows a poor etching resistance. The maleic anhydride-cycloolefin polymer is superior in etching resistance to the acrylate polymer but has a high optical absorbance in the wavelength range of the ArF excimer laser, resulting in poor perpendicularity of the photoresist pattern. Furthermore, the maleic anhydride monomer is liable to hydrolysis and a resist formulation comprising the maleic anhydride monomer has low storage stability.

DETAILED DESCRIPTION OF THE INVENTION

It is therefore an object of the present invention to provide a polymer for use in a chemically amplified resist, which may be exposed to KrF or ArF excimer laser and have low dependence on and good adhesion to substrate, high transparency in the wavelength range of the above radiation, strong resistance to dry etching, and excellencies in sensitivity, resolution and developability.

It is another object of the present invention to provide a resist composition containing such a polymer.

It is still another object of the present invention to increase the etching resistance of the polymer with a maximized content of saturated aliphatic ring in the polymer.

To achieve the objects of the present invention, there is provided a novel polymer represented by the formula 1:

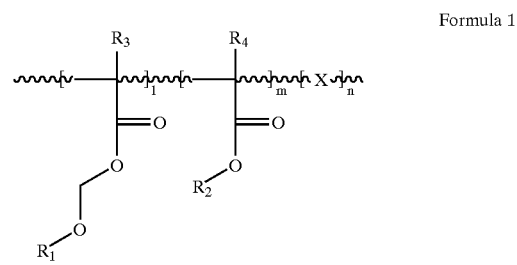

Formula 1 where $R_1$ is an alkyl group having 1 to 30 carbon atoms; $R_2$ is hydrogen or an alkyl group having 1 to 30 carbon atoms; $R_3$ and $R_4$ are independently hydrogen or a methyl group; X is vinyl ether derivative, styrene derivative or olefin derivative; and l, m and n are a repeat unit of the polymer, wherein l is 0.05 to 0.9, m is 0 to 0.7, and n is 0 to 0.7.

Now, the present invention will be described in more detail as follows.

Polymer

The use of a polyacrylate resist in forming a photoresist pattern may be problematic in regard to edge roughness of the pattern. To solve this problem, the present invention applies an alkoxyalkyl acrylate monomer, which is subjected to an acid-promoted deprotection reaction to give alkyl alcohol compounds, formaldehyde and carboxylic acid compounds. The alkyl alcohol compounds thus formed act as a solvent or a plasticizer in the resist pattern to reduce the edge roughness of the pattern.

The alkoxyalkyl acrylate monomer participates in a deprotection reaction given by the following reaction formula 1:

Reaction Formula 1

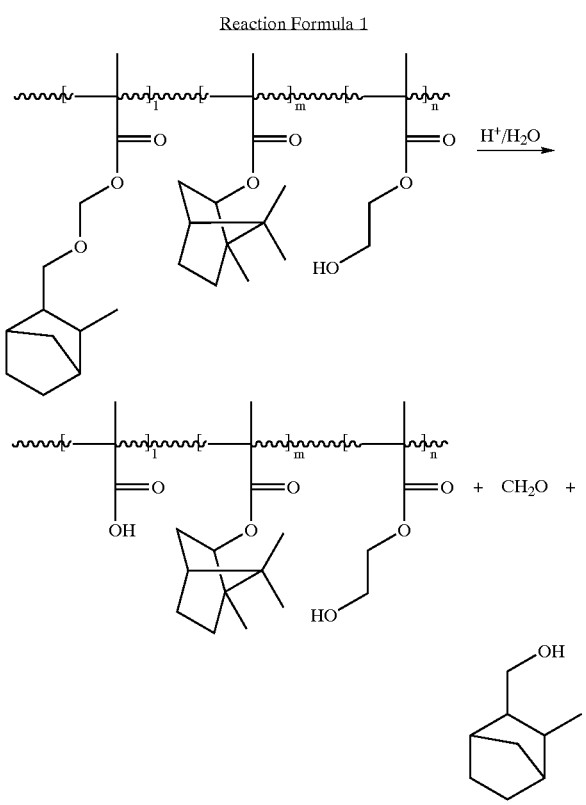

The conventionally used acrylate polymer that has a low glass transition temperature (Tg) and a poor etching resistance is inapplicable to the processing of semiconductor devices. The maleic anhydride-cycloolefin polymer is also unusable in the processing of semiconductor devices due to its high optical absorbance that may deteriorate perpendicularity and resolution of the photoresist pattern.

To solve this problem with the conventional polymers, the present invention employs an acrylate monomer having an alicyclic group to enhance low glass transition temperature and the etching resistance of the acrylate polymer. The alicyclic group of the acrylate polymer increases the etching resistance and includes an acid-liable group.

If necessary, the polymer of the present invention may additionally comprise a vinyl ether derivative, a styrene derivative, or olefin derivative. The polymer is insoluble or not easily soluble but, if necessary, may be soluble. Also, the polymer has an acid-liable functional group in the side chain but, if necessary, may have no acid-liable functional group.

Preferably, the polymer represented by the formula 1 is contained in an amount of at least 5% of the monomer having a repeat unit 1 of the reaction formula 1.

The solubility of the polymer is dependent on the type or the content of the monomer. Typically, the solubility of the polymer to an aqueous alkali solution is decreased with an increase in the content of hydrophobic groups. The use of a polymer in which the type and the content of the monomer are properly controlled allows a resist composition excellent in adhesion to and independence on substrate, sensitivity and resolution.

The poly-component copolymer of the present invention as represented by the formula 1 may include block copolymer, random copolymer or graft copolymer.

The polymerization of the polymer having the formula 1 may be achieved by a known method, preferably, radical polymerization. A polymerization initiator used in the radical polymerization may include, if not specifically limited to, azobisisobutyronitrile (AIBN), benzoyl peroxide (BPO), lauryl peroxide, azobisisocapronitrile, azobisisovaleronitrile and tert-butyl hydroperoxide. The polymerization may be carried out in a manner of, if not specifically limited to, bulk polymerization, solution polymerization, suspension polymerization, bulk-suspension polymerization or emulsion polymerization. Examples of useful polymerization solvents may include at least one of benzene, toluene, xylene, halogenated benzene, diethylether, tetrahydrofuran, esters, ethers, lactones, ketones and amides.

The polymerization temperature is dependent on the polymerization catalyst employed. As for the molecular weight distribution of the polymer prepared, it can be controlled by varying the amount of the polymerization initiator and the period of polymerization time. After the completion of the polymerization, monomer residues remaining unreacted in the reaction mixture, and by-products are preferably removed by solvent precipitation.

The polystyrene-reduced weight average molecular weight (hereinafter, abbreviated to "$M_w$") of the polymer as measured by gel-permeation chromatography (GPC) is typically 2,000 to 1,000,000 and preferably 3,000 to 50,000 when taking into account the sensitivity, developability, coatability and thermal resistance that are required for a photoresist. The molecular weight distribution of the polymer preferably ranges from 1.0 to 5.0 and more preferably from 1.0 to 3.0.

Preferably, the resist composition comprises at least 3 wt. % of the polymer.

Photoacid Generator

Examples of the photoacid generator useful in the resist composition of the present invention may include iodonium salt, sulfonium salt, phosphonium salt, diazonium salt, pyridinium salt, and imides. Preferred is a sulfonium salt represented by the following formulas 2 or 3.

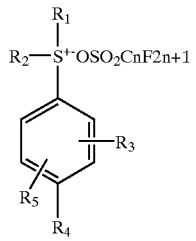

Formula 2

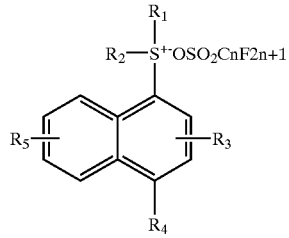

Formula 3 where $R_1$ and $R_2$ are independently alkyl, allyl, perfluoroalkyl, benzyl or aryl; $R_3$, $R_4$ and $R_5$ are independently hydrogen, alkyl, halogen, alkoxyl, aryl, thiophenoxy, thioalkoxy or alkoxycarbonylmethoxy; and n is an integer ranging from 1 to 8.

The photoacid generator is used in an amount of 0.1 to 30 parts by weight based on 100 parts by weight of the solid content of the photoresist composition, and preferably 0.3 to 10 parts by weight. The photoacid generator may be used alone or in combinations of at least two species.

Others

In the resist composition of the present invention, there can be optionally used a compound that is decomposed by acid to promote the dissolution of the photoresist in a developing solution. Examples of the compound may include an alicyclic derivative having an acid-liable group, such as tert-butyl ester or alkoxyalkanyl ester. Upon formulation of the resist, such a compound may be added in an amount of 2 to 60 parts by weight based on 100 parts by weight of the solid content of the photoresist composition, and preferably 5 to 40 parts by weight.

Optionally, the resist composition of the present invention may comprise additives, such as surfactant, halation inhibitor, adhesive assistant agent, preservation stabilizer, antifoaming agent and the like.

The resist composition may also comprise a base additive in order to prevent diffusion of acids generated after the exposure process. The base additive must be used in a proper amount depending on its basicity, because the sensitivity of the photoresist is lowered with an increase in the amount of the base additive. The added amount of the base additive is preferably 0.01 to 5 parts by weight based on 100 parts by weight of the solid content of the resist composition.

To obtain a uniform and flat photoresist coating, the resist composition of the present invention has to be dissolved in a solvent that shows an appropriate evaporation rate and viscosity. Examples of such a solvent may include ethyleneglycol monomethyl ether, ethyleneglycol monoethyl ether, ethyleneglycol monopropyl ether, methylcellosolve acetate, ethylcellosolve acetate, propyleneglycol monomethyl ether acetate, propyleneglycol monoethyl ether acetate, propyleneglycol monopropyl ether acetate, methyl isopropyl ketone, cyclohexanone, methyl 2-hydroxypropionate, ethyl 2-hydroxypropionate, 2-heptanone, ethyl lactate, and γ-butyrolactone. If necessary, they may be used alone or in combinations of at least two species.

Depending on its properties, such as volatility and viscosity, the solvent is used in such an appropriate amount that a uniform and flat photoresist coating can be formed on a wafer.

The resist composition of the present invention prepared in the form of a solution is coated on a wafer and dried to form a photoresist film. After being filtered, the photoresist solution may be coated on the substrate by a spin coating, casting or roll coating technique.

Then, selective irradiation is performed on the coated photoresist film to give fine patterns. The radiation as used herein may include, if not specifically limited to, i-ray, KrF or ArF excimer laser, X-rays, or charged particle rays (e.g., electron beam), which can be selected depending on the type of the photoacid generator employed.

Generally, the formation of photoresist pattern is finally completed in a developing solution. Examples of the developing solution may include aqueous solutions of sodium hydroxide, potassium hydroxide, sodium carbonate, sodium silicate, sodium metasilicate, ammonia water, ethyl amine, n-propyl amine, triethyl amine, tetramethylammonium hydroxide and tetraethylammonium hydroxide. Most preferred is tetramethylammonium hydroxide. If necessary, additives, such as surfactant and aqueous alcohol, can be employed.

Hereinafter, the present invention will be described in detail by way of the following examples, which are not intended to limit the scope of the present invention.

Synthesis Example 1

Synthesis of Polymer Represented by Formula 4

To a 500 ml flask were added 60 g of methylnorbornanemethoxymethyl methacrylate, 56 g of isobornyl methacxylate, 10 g of AIBN and 232 g of dioxane. Nitrogen gas was introduced into the reactor to replace oxygen in the reactor with nitrogen and the reactor was then heated to 70° C. with stirring for 2 hours. The reaction mixture was kept for 2 hours and the reactor was cooled to the room temperature. Subsequently, the polymer product was precipitated in an excess of methanol. The precipitate thus formed was filtered, washed and dried to yield a polymer represented by the following formula 4.

Formula 4

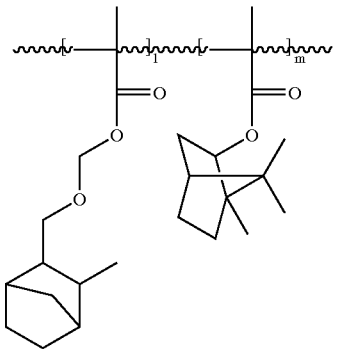

Synthesis Example 2

Synthesis of Polymer Represented by the Formula 5

The procedures were performed in the same manner as described in synthesis example 1, except for using 60 g of methylnorbornanemethoxymethyl methacrylate, 45 g of isobornyl methacrylate, 16 g of hydroxyethyl methacrylate, 11 g of AIBN and 222 g of dioxane to yield a polymer represented by the following formula 5.

Formula 5

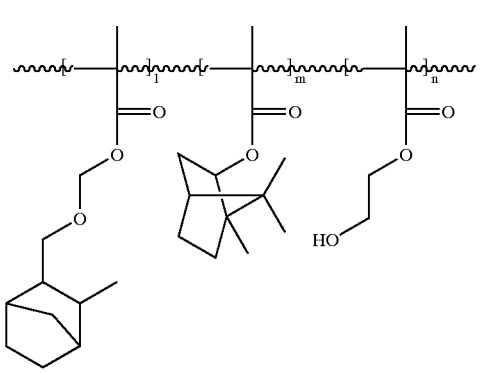

Synthesis Example 3

Synthesis of Polymer Represented by the Formula 6

The procedures were performed in the same manner as described in synthesis example 1, except for using 60 g of methylnorbornanemethoxymethyl methacrylate, 45 g of isobornyl methacrylate, 15 g of cyclohexyl vinyl ether, 10 g of AIBN and 240 g of dioxane to yield a polymer represented by the following formula 6.

Formula 6

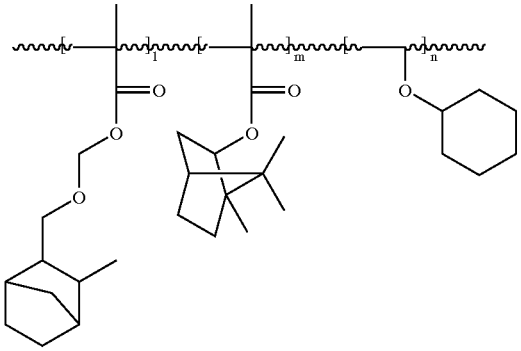

Synthesis Example 4

Synthesis of Polymer Represented by the Formula 7

The procedures were performed in the same manner as described in synthesis example 1, except for using 36 g of methylnorbornanemethoxymethyl methacrylate, 45 g of isobronyl methacrylate, 23 g of methyladamanthyl methacrylate, 5 g of methacrylic acid, 10 g of AIBN and 228 g of dioxane to yield a polymer represented by the following formula 7.

Formula 7

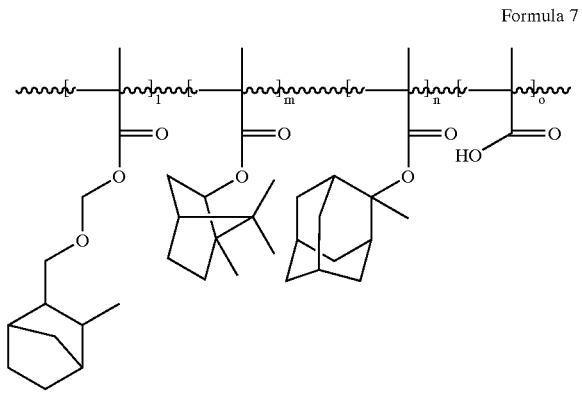

Synthesis Example 5

Synthesis of Polymer Represented by the Formula 8

The procedures were performed in the same manner as described in synthesis example 1, except for using 36 g of methylnorbornanemethoxymethyl methacrylate, 45 g of isobornyl methacrylate, 86 g of norbornene, 5 g of methacrylic acid, 10 g of AIBN and 228 g of dioxane to yield a polymer represented by the following formula 8.

Formula 8

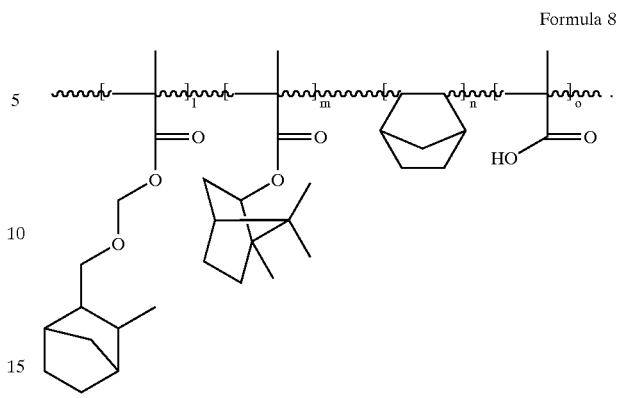

EXAMPLE 1

To 100 parts by weight of the polymer obtained in Synthesis Example 1 were added 1.4 parts by weight of 4-tert-butylphenyl diphenylsulonium triflate as a photoacid generator and triethylamine as a base additive. The mixture was dissolved in 600 parts by weight of propyleneglycol methylether acetate, followed by filtration with a 0.2 $\mu$m thick filter to yield a resist solution.

The resist solution thus obtained was coated on a substrate by spin coating and dried at 110° C. for 90 seconds to form a coating. This coating was exposed with ArF excimer laser equipment and annealed at 130° C. for 90 seconds. After the substrate was cooled, the exposed coating was immersed in an aqueous solution containing 2.38 wt. % of tetramethylammonium hydroxide for 40 seconds for development, washed and dried to form a photoresist pattern. This pattern was good in adhesion to substrate and had a resolution of 0.15 $\mu$m and a sensitivity of 18 mJ/cm$^2$.

EXAMPLE 2

The procedures were performed in the same manner as described in Example 1, excepting that a polymer obtained in Synthesis Example 2 was used instead of a polymer from Synthesis Example 1. The pattern thus formed had a resolution of 0.13 $\mu$m and a sensitivity of 15 mJ/cm$^2$.

EXAMPLE 3

The procedures were performed in the same manner as described in Example 1, excepting that a polymer obtained in Synthesis Example 3 was used instead of a polymer from Synthesis Example 1. The pattern thus formed had a resolution of 0.14 $\mu$m and a sensitivity of 17 mJ/cm$^2$.

EXAMPLE 4

The procedures were performed in the same manner as described in Example 1, excepting that a polymer obtained in Synthesis Example 4 was used instead of a polymer from Synthesis Example 1. The pattern thus formed had a resolution of 0.12 $\mu$m and a sensitivity of 14 mJ/cm$^2$.

EXAMPLE 5

The procedures were performed in the same manner as described in Example 1, excepting that a polymer obtained in Synthesis Example 5 was used instead of a polymer from Synthesis Example 1. The pattern thus formed had a resolution of 0.15 $\mu$m and a sensitivity of 17 mJ/cm$^2$.

As described above, the present invention provides a novel polymer comprising an alkoxyalkyl acrylate monomer and an acrylate monomer having an alicyclic group, and a novel resist composition comprising the novel polymer and a photoacid generator to allow formation of a photoresist pattern, which may be exposed to KrF or ArF excimer laser and show reduced edge roughness, low dependency on and good adhesion to substrate, high transparency in the wavelength range of the ultraviolet region, high resistance to dry etching, and excellencies in sensitivity, resolution and developability.

What is claimed is:

1. A polymer for use in a chemically amplified resist, the polymer being represented by the following formula I:

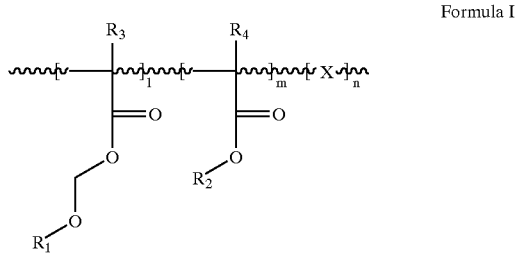

Formula I wherein $R_1$ is a cyclic alkyl group having 5 to 30 carbon atoms;

$R_2$ is hydrogen or an alkyl group having 1 to 30 carbon atoms;

$R_3$ and $R_4$ are independently hydrogen or a methyl group;

X is vinyl ether derivative, styrene derivative, or olefin derivative; and l, m and n are a repeat unit of the polymer, wherein l is 0.05 to 0.9, m is 0.1 to 0.7, n is 0 to 0.7.

2. The polymer as claimed in claim 1, wherein the polymer represented by formula I comprises a monomer having a repeat unit 1 in an amount of at least 5% of the total monomer content of the polymer.

3. A chemically amplified resist composition comprising a copolymer of at least one polymer represented by the following formula I, a photoacid generator, an additive, and a solvent:

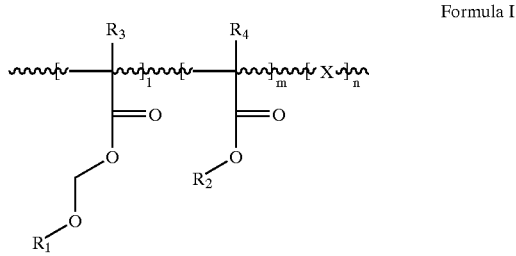

Formula I wherein $R_1$ is a cyclic alkyl group having 5 to 30 carbon atoms;

$R_2$ is hydrogen or an alkyl group having 1 to 30 carbon atoms;

$R_3$ and $R_4$ are independently hydrogen or a methyl group;

X is vinyl ether derivative, styrene derivative, or olefin derivative; and l, m and n are a repeat unit of the polymer, wherein l is 0.05 to 0.9, m is 0.1 to 0.7, n is 0 to 0.7.

4. The chemically amplified resist composition as claimed in claim 3, wherein the photoacid generator comprises at least one compound represented by the following formulas II and III:

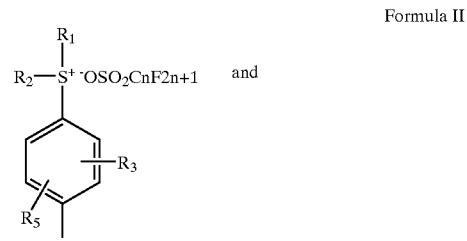

Formula II

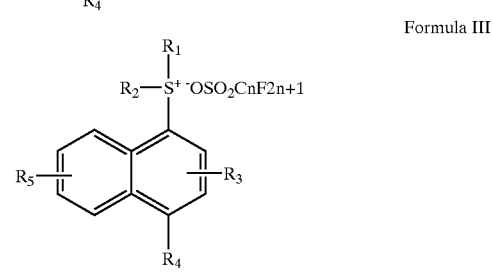

Formula III wherein $R_1$ and $R_2$ are independently alkyl, allyl, perfluoroalkyl, benzyl or aryl;

$R_3$, $R_4$ and $R_5$ are independently hydrogen, alkyl, halogen, alkoxyl, aryl, thiophenoxy, thioalkoxy or alkoxycarbonylmethoxy; and n is an integer ranging from 1 to 8.

5. The chemically amplified resist composition as claimed in claim 4, wherein the photoacid generator is contained in an amount of 0.3 to 10 parts by weight based on 100 parts by weight of the solid content of the chemically amplified resist composition.

6. The chemically amplified resist composition as claimed in claim 3, wherein the photoacid generator is contained in an amount of 0.3 to 10 parts by weight based on 100 parts by weight of the solid content of the chemically amplified resist composition.

7. The chemically amplified resist composition as claimed in claim 3, wherein the polymer represented by formula I is contained in an amount of at least 3% of the chemically amplified resist composition.

8. The chemically amplified resist composition as claimed in claim 3, wherein the polymer represented by formula I comprises a monomer having a repeat unit 1 in an amount of at least 5% of the total monomer content of the polymer.

9. A patterning method comprising exposing the chemically amplified resist composition according to claim 3 using a radiation selected from ultraviolet(UV), X-ray or electron beam.

* * * * *